United States Patent
Goerlach

(10) Patent No.: US 10,923,587 B2
(45) Date of Patent: Feb. 16, 2021

(54) POWER MOSFET AND METHOD FOR PRODUCING A POWER MOSFET

(71) Applicant: Robert Bosch GmbH, Stuttgart (DE)

(72) Inventor: Alfred Goerlach, Kusterdingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/771,123

(22) PCT Filed: Aug. 29, 2016

(86) PCT No.: PCT/EP2016/070330
§ 371 (c)(1),
(2) Date: Apr. 27, 2018

(87) PCT Pub. No.: WO2017/071855
PCT Pub. Date: May 4, 2017

(65) Prior Publication Data
US 2018/0315847 A1    Nov. 1, 2018

(30) Foreign Application Priority Data

Oct. 28, 2015    (DE) ..................... 10 2015 221 054.5

(51) Int. Cl.
*H01L 29/78* (2006.01)
*H01L 29/40* (2006.01)
(Continued)

(52) U.S. Cl.
CPC ...... *H01L 29/7813* (2013.01); *H01L 29/1095* (2013.01); *H01L 29/407* (2013.01); *H01L 29/41766* (2013.01); *H01L 29/7803* (2013.01)

(58) Field of Classification Search
CPC ............. H01L 29/7802; H01L 29/7813; H01L 29/1095; H01L 29/407; H01L 29/41766; H01L 29/7803
See application file for complete search history.

(56) References Cited

U.S. PATENT DOCUMENTS

| 5,910,669 A | 6/1999 | Chang et al. |
| 2005/0167695 A1 | 8/2005 | Yilmaz |

(Continued)

FOREIGN PATENT DOCUMENTS

| CN | 204102907 U | 1/2015 |
| EP | 0580452 A1 | 1/1994 |

(Continued)

OTHER PUBLICATIONS

International Search Report dated Nov. 25, 2016, of the corresponding International Application PCT/ EP2016/070330 filed Aug. 29, 2016.

*Primary Examiner* — Sue A Purvis
*Assistant Examiner* — Scott Stowe
(74) *Attorney, Agent, or Firm* — Norton Rose Fulbright US LLP; Gerard A. Messina

(57) ABSTRACT

A power MOSFET having a substrate that has a substrate surface into which a trench structure is introduced, wherein first trenches and second trenches form the trench structure. The first trenches and second trenches are arranged in alternation. The first trenches are filled at least partially with a first material and the second trenches are filled with a second material. The first material has a first conductivity type and the second material has a second conductivity type, the first conductivity type and the second conductivity type being different from each other.

12 Claims, 2 Drawing Sheets

(51) Int. Cl.
  *H01L 29/417* (2006.01)
  *H01L 29/10* (2006.01)

(56) References Cited

U.S. PATENT DOCUMENTS

2012/0261676 A1   10/2012  Nakano
2013/0134487 A1*  5/2013  Lin .................. H01L 29/66712
                                                                               257/288
2017/0092717 A1*  3/2017  Meiser .............. H01L 21/02639

FOREIGN PATENT DOCUMENTS

JP        2002270841 A    9/2002
TW         201318166 A    5/2013

\* cited by examiner

POWER MOSFET AND METHOD FOR PRODUCING A POWER MOSFET

FIELD

The present invention relates to a power metal-oxide semiconductor field-effect transistor MOSFET and a method for producing such a power MOSFET.

BACKGROUND INFORMATION

Power MOSFETS are used in power electronics as fast switches. Apart from planar, double-diffused structures, power MOSFETS are mainly used that have trench structures. In an application case, the drain terminal has a positive potential while the source terminal is connected to ground. If a sufficient positive gate voltage is applied on the source terminal, a thin electron inversion channel is formed in the body area on the boundary surface to the gate oxide. This electron inversion channel extends from the source terminal to an epilayer so that the power MOSFET is conductive. If the drain potential is increased, a space charge region is formed, which extends primarily from the trench bottoms into the epilayer. This means that the highest field strength exists near the trench bottoms. If the drain voltage is increased further, the field strength continues to rise in the epilayer so that an avalanche breakdown occurs. A high current flow is produced in the process so that the drain voltage is limited.

A disadvantage in this regard is that minority carriers, which are produced by the avalanche breakdown, are injected into the gate oxide due to the high field strength. This produces positive charges firmly incorporated in the gate oxide, which changes and permanently damages the properties of the power MOSFET. These changes in the power MOSFET reduce the threshold voltage for example.

For some applications in power electronics, however, it is necessary to operate the power MOSFET in the avalanche breakdown. In this manner it is possible to limit voltage spikes of the system without elaborate protective circuits being necessary.

An objective of the present invention is to provide a long-term-stable power MOSFET that can be operated in avalanche breakdown.

SUMMARY

The power MOSFET comprises a substrate that has a substrate surface into which a trench structure is introduced. According to the present invention, the trench structure is formed by a number of first trenches and a number of second trenches. First trenches and second trenches are arranged alternately side by side. This means that next to a first trench there is a second trench, next to which in turn there is another first trench and next to it there is in turn another second trench, etc. The number of first trenches and second trenches is arbitrary. The first trenches are at least partially filled with a first material. The second trenches are filled with a second material. The first material has a first conductivity type and the second material has a second conductivity type. The first conductivity type differs from the second conductivity type.

The advantage in this regard is that the blocking voltage breakdown or avalanche breakdown occurs on the bottom of the second trenches so that the produced minority carriers are discharged directly to the source terminal without there being a significant harmful injection of the minority carriers into the gate oxide. In this manner, the breakdown voltage and the threshold voltage remain stable so that the power MOSFET remains stable over the long term and may be operated in avalanche breakdown without performance penalties.

In a further development of the present invention, the substrate comprises at least one source layer, a body layer, an epilayer and a silicon layer. These layers are arranged one upon the other. This means that the source layer is situated directly on top of the body layer, the body layer directly on top of the epilayer and the epilayer on top of the silicon layer. The term source layer is to be understood here as a layer that is connectible or is connected to a source terminal. The source layer comprises a third material, the epilayer a fifth material and the silicon layer a sixth material, the third material, the fifth material and the sixth material having the first conductivity type. The body layer comprises a fourth material, the fourth material having the second conductivity type. The first trenches and the second trenches extend at least into the epilayer.

The advantage in this regard is that it is possible to operate the power MOSFET in the breakdown range at high currents.

In another development of the present invention, an intermediate layer is situated between the epilayer and the silicon layer, which has a higher doping than the epilayer. The intermediate layer comprises a seventh material that has the first conductivity type.

The advantage in this regard is that it is possible to set the doping of this layer very precisely in the production process.

This is the case in particular if this intermediate layer is produced using ion implantation. Consequently, the breakdown voltage has only a low margin of fluctuation.

In one development, the second trenches extend at least into the intermediate layer.

It is advantageous in this regard that it is possible to set the breakdown voltage and that the latter is subject to only very slight fluctuations.

In another development, the silicon layer is situated on a first metal layer, which functions as a backside metallization.

The advantage in this regard is that a drain terminal is provided in a simple manner.

In one development, the first conductivity type is an n-type doping and the second conductivity type is a p-type doping.

In another development, the second trenches have a greater width than the first trenches.

The advantage in this regard is that it is possible to produce the wider trenches with the same process step as the first trenches.

In one development, the second material has boron ions.

The advantage in this regard is that it is possible to introduce the second material in the second trenches in a simple manner and that it forms a p-n junction with the fifth and seventh material, respectively.

In another development, the concentration of the boron ions on the surface of the second trenches is greater than $10^{18}$ cm$^{-3}$.

It is advantageous in this regard that the second trenches together with a contact metal or contact silicide form an Ohmic contact.

The method of the present invention for producing a power MOSFET having a trench structure comprises the production of first trenches, the production of second trenches, the first trenches and the second trenches forming the trench structure and the first trenches and the second trenches being arranged in alternating fashion. The first trenches are partially filled with a first material that has a first conductivity type. The second trenches are filled with a second material that has a second conductivity type, the first conductivity type and the second conductivity type differing from each other.

In another development, a dielectric layer is produced on the trench surface of the first trenches, in particular by thermal oxidation.

In one development, a tempering step is performed at a temperature in the range between 850° C. and 1000° C. and a duration of 30 seconds to three minutes.

Further advantages result from the description below of exemplary embodiments.

BRIEF DESCRIPTION OF THE DRAWINGS

The present invention is explained below with reference to preferred specific embodiments and the figures.

DETAILED DESCRIPTION OF EXAMPLE EMBODIMENTS

Figure 1:
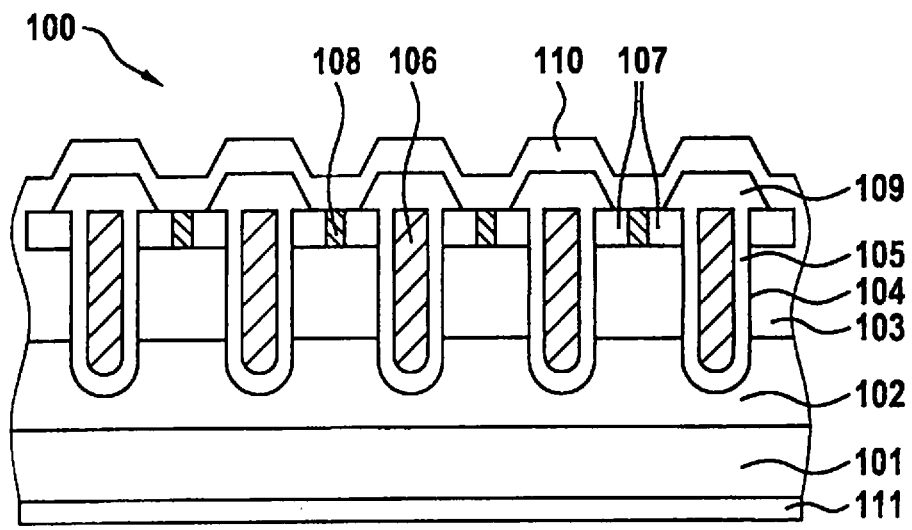
FIG. 1 shows a power MOSFET from the related art.

FIG. 1 shows a power MOSFET 100 having a trench structure from the related art. The power MOSFET has a substrate having a substrate surface, the substrate being made up of a source layer 107, a body layer 103, an epilayer 102 and a silicon layer 101. Source layer 107 and silicon layer 101 are n$^+$-doped, the body layer is p-doped and epilayer 102 is n-doped. Highly doped p$^+$ areas 108 are introduced into source layer 107, which allow for an Ohmic contact to the body layer. The trench structure is introduced into the substrate surface. Trenches 104 extend into epilayer 102. A first dielectric layer 105 is situated on the trench surface, which functions as gate oxide. Trenches 104 are filled for example with an n-doped polycrystalline silicon and form the gate terminal, trenches 104 being galvanically connected to one another for this purpose. For reasons of clarity, the gate terminal is not shown in FIG. 1. It is brought out on the substrate surface or upper side of the power MOSFET. Silicon layer 101 is situated on a first metal layer 111, which represents the drain terminal. A patterned second dielectric layer 109 is situated on source layer 107, which completely closes, i.e., electrically insulates, trenches 104. A second metal layer 110 is situated on source layer 107, which is directly electrically connected to source layer 107 and the p$^+$-doped areas 108 so as to form additional Ohmic contacts.

Figure 2:
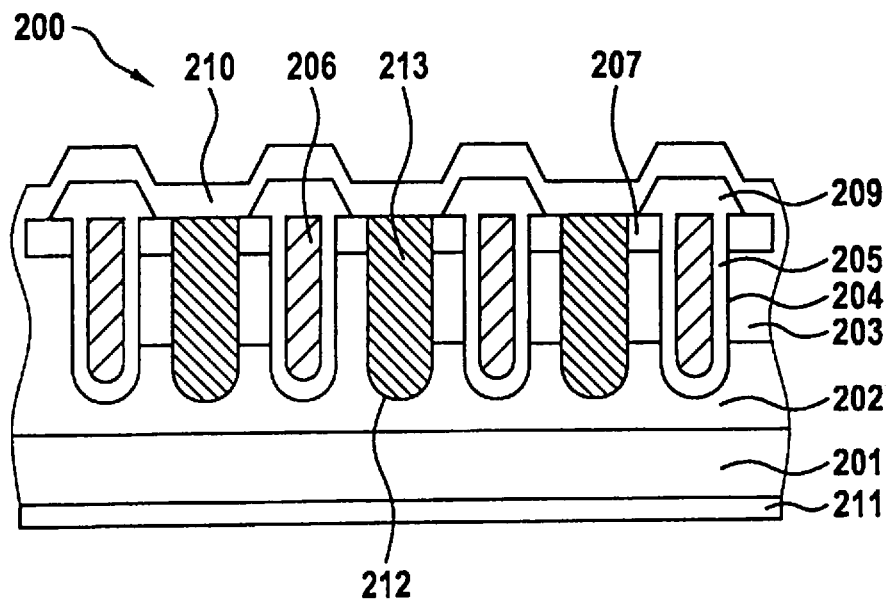
FIG. 2 shows a first embodiment of a power MOSFET according to the invention.

FIG. 2 shows a first embodiment of the power MOSFET 200 of the present invention with a trench structure. Power MOSFET 200 comprises a first metal layer 211, a silicon layer 201, an epilayer 202, a body layer 203, a source layer 207, a second dielectric layer 209 and a second metal layer 210. First metal layer 211 functions as a drain terminal and second metal layer 209 as a source terminal. The substrate of power MOSFET 200 is formed by source layer 207, body layer 203, epilayer 202 and silicon layer 201.

The trench structure is introduced into a substrate surface, the substrate surface being formed by source layer 207. The trench structure has different types of trenches, first trenches 204 and second trenches 212, first trenches 204 and second trenches 212 being arranged alternately side by side. On the trench surface, first trenches 204 comprise a first dielectric layer 205, which functions as a gate oxide. First trenches 204 are partially filled with a first material 206. In other words, a thin oxide layer 205 is situated between first material 206 and the trench surface. First trenches 2014 are galvanically connected to one another so that first material 206 forms the gate terminal. The gate terminal is also not drawn in FIG. 2 for reasons of clarity. First material 206 has a first conductivity type. The second trenches are completely filled with a second material 213. Second material 213 has a second conductivity type. First conductivity type and second conductivity type differ from each other. First trenches 204 are electrically insulated from second metal layer 210 by second dielectric layer 209. This means that second dielectric layer 209 closes first trenches 204.

First dielectric layer 205 comprises for example silicon oxide of a thickness in the range of 5-150 nanometers, preferably 60 nanometers. Second dielectric layer has a height of at least 100 nanometers, in particular a range of 100-2000 nanometers, preferably essentially 400 nanometers. First metal layer 211 comprises a solderable metal having for example a layer sequence made up of Cr, NiV and Ag. Second metal layer 210 comprises aluminum for example. First material 206 and second material 213 comprise polycrystalline silicon. First material 206 comprises for example n-doped polycrystalline silicon, second material 213 p-doped polycrystalline silicon, third material 207 n$^+$-doped monocrystalline silicon, fourth material 203 p-doped monocrystalline silicon, fifth material 202 n-doped monocrystalline silicon and sixth material 201 n$^+$-doped monocrystalline silicon.

The magnitude of the doping concentrations and extensions of the areas depend inter alia on the desired breakdown voltage of the power MOSFET. For a MOSFET of the 40V voltage class, third highly n$^+$-doped material 207 has a concentration greater than $10^{19}$ cm$^{-3}$, p-doped material 203 has a doping in the range of $10^{17}$ cm$^{-3}$ and the doping of the epilayer some $10^{16}$ cm$^{-3}$. The sixth material should be doped as highly as possible, for example $10^{21}$ cm$^{-3}$. Normally the doping profiles of layers 207 and 203 are not constant, but decrease with increasing distance from the surface.

Figure 3:
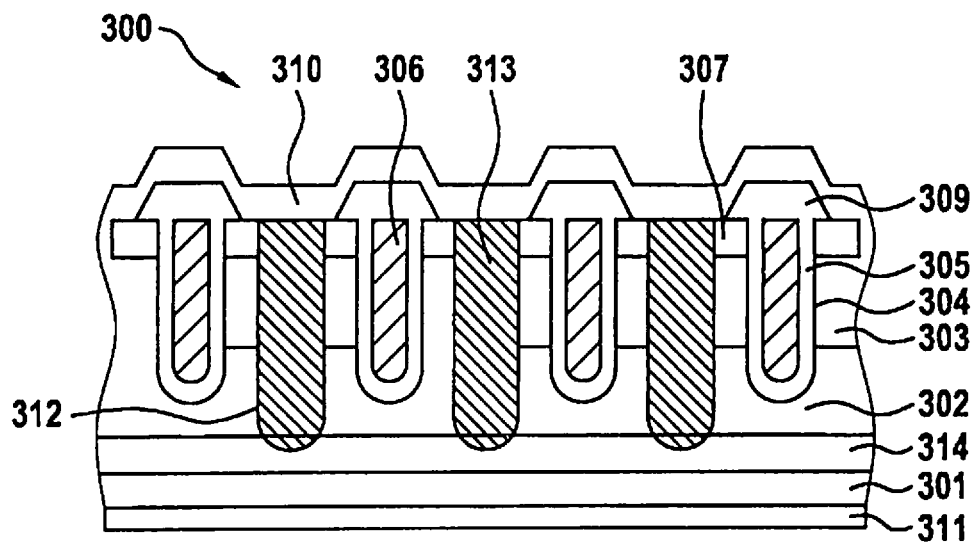
FIG. 3 shows a second embodiment of the power MOSFET according to the invention.

FIG. 3 shows a second embodiment of the power MOSFET 300 of the present invention. Features in FIG. 3 that have the same meaning have identical final digits of the reference numerals as the reference numerals in FIG. 2. Power MOSFET 300 is expanded vis-a-vis power MOSFET 200 in that an intermediate layer 314 is situated between epilayer 302 and silicon layer 301. Intermediate layer 314 comprises a seventh material that has the first conductivity type. In this instance, its doping is chosen to be higher than the doping of epilayer 302 and lower than the doping of silicon layer 301. The intermediate layer is doped for example with As, Sb or phosphorus.

Second trenches 312 extend into intermediate layer 314. This produces an avalanche breakdown of the power MOSFET at a p/n junction, which results on account of the direct contact of second trenches 312 and intermediate layer 314.

The first conductivity type comprises an n-type doping and the second conductivity type a p-type doping. Alternatively, the first conductivity type comprises a p-type doping and the second conductivity type an n-type doping.

The second material 213 and 313 is doped with boron ions for example.

In one exemplary embodiment, second trenches 212 and 312 have the same depth as first trenches 204 and 304. First trenches 204 and 304 and second trenches 212 and 312 extend into epilayer 202 and 302.

In another exemplary embodiment, second trenches 212 and 312 have a greater depth than first trenches 204 and 304. Second trenches 212 and 312 extend in this instance into silicon layer 201 and 301. This causes an avalanche breakdown of the power MOSFET at a p/n junction between second trenches 212 and 312 and epilayer 202 and 302. This means that the blocking voltage depends on the depth of the filled second trenches.

In another exemplary embodiment, first trenches 204 and 304 respectively comprise a magnetoresistor, which is situated below first material 206 and 306 or the actual gate within first trenches 204 and 304. The magnetoresistor comprises n-type doped polycrystalline silicon, which is surrounded by an oxide layer whose thickness is greater than that of the gate oxide. This oxide layer electrically insulates the magnetoresistor on the one hand from the actual gate and on the other hand from epilayer 202 and 302.

In another exemplary embodiment, first material 206 and 306 is electrically connected to second metal layer 210 and 310 so that the MOSFET functions as a diode. In this instance, first metal layer 211 and 311 forms the cathode terminal and second metal layer 210 and 310 forms the anode terminal. The thickness of first dielectric layer 205 and 305 has a maximum value of 15 nanometers. A very low threshold voltage and thus a low forward voltage of the MOS diode is thereby achieved.

In another exemplary embodiment, first material 106 and 206 is galvanically connected to second material 212 and 312 and third material 207 and 307. In this instance, the thickness of gate oxide 205 and 305 is less than 15 nanometers.

Figure 4:
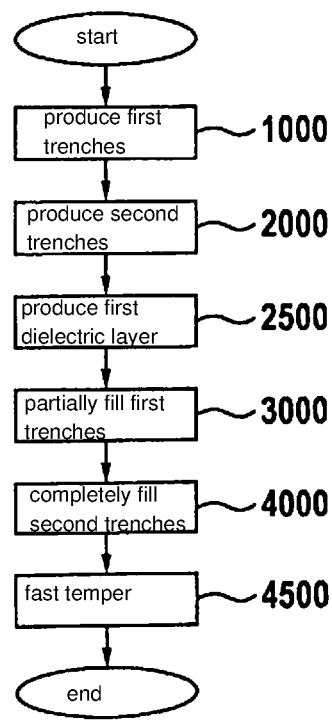
FIG. 4 shows a method for producing the power MOSFET according to the invention.

FIG. 4 describes a method for producing a power MOSFET having a trench structure. The method starts with a step 1000, in which first trenches are produced. In a subsequent step 2000, second trenches are produced, first trenches and second trenches forming the trench structure. First trenches and second trenches are arranged alternately side by side. In a subsequent step 2500, a first dielectric layer is produced on the trench surface of first trenches, for example by thermal oxidation. In a subsequent step 3000, first trenches are partially filled with a first material, the first material having a first conductivity type. In a subsequent step 4000, second trenches are completely filled with a second material, the second material having a second conductivity type. First conductivity type and second conductivity type differ from each other.

In one exemplary embodiment, the second trenches are cleaned and thermally oxidized prior to step 4000. The silicon oxide forming in the process—of a thickness of 40 nanometers for example—is subsequently removed entirely. This may be done by a wet chemical etching process. In other words, following a cleaning step, there is a temporary oxidation of the second trenches. Immediately afterwards, in step 4000, the second trenches are filled with the second material. For this purpose, polysilicon is deposited in an LPCVD process at temperatures of approximately 650° C. and is doped in situ with boron ions. The boron concentration in this instance is approximately $5*10^{18}$ cm$^{-3}$. Fundamentally, the boron doping may also be performed after the filling with undoped polysilicon by ion implantation. In a fast tempering step 4500 following step 4000, the boron ions are activated and there is a slight diffusion into the epilayer. This tempering step or temperature step is also known as rapid thermal processing. For this purpose, a temperature between 850° C. and 1000° C., preferably 900° C., is used for example. The duration of the temperature step is between 30 seconds and three minutes. In this manner, the penetration depth of the boron ions into the epilayer amounts to approximately 25 nm-200 nm. Through these supposed contaminations of the n-doped epilayer with boron, a nearly ideal p/n junctions is produced between the second trenches and the epilayer.

What is claimed is:

1. A power MOSFET, comprising:
a substrate that has a substrate surface into which a trench structure is provided, wherein first trenches and second trenches form the trench structure, the first trenches and the second trenches being arranged in alternation, the first trenches being filled at least partially with a first material and the second trenches being filled with a second material, the first material having a first conductivity type and the second material having a second conductivity type, the first conductivity type and the second conductivity type differing from each other,
wherein the substrate includes a source layer, a body layer, an epilayer, an intermediate later, and a silicon layer, wherein the intermediate layer is situated between the epilayer and the silicon layer,
wherein the intermediate layer has a higher doping than the epilayer, and the intermediate layer has a material that has the first conductivity type,
wherein the second trenches extend into the intermediate layer.

2. A power MOSFET, comprising:
a substrate that has a substrate surface into which a trench structure is provided, wherein first trenches and second trenches form the trench structure, the first trenches and the second trenches being arranged in alternation, the first trenches being filled at least partially with a first material and the second trenches being filled with a second material, the first material having a first conductivity type and the second material having a second conductivity type, the first conductivity type and the second conductivity type differing from each other,
wherein the substrate includes at least one source layer, a body layer, an epilayer, and a silicon layer, the source layer being situated directly on the body layer, the body layer being situated directly on the epilayer, and the epilayer being situated on the silicon layer, the source layer including a third material, the epilayer including a fifth material, and the silicon layer including a sixth material, the third material, the fifth material and the sixth material having the first conductivity type, the body layer including a fourth material, the fourth material having the second conductivity type, the first trenches and the second trenches extending at least into the epilayer.

3. The power MOSFET as recited in claim 2, wherein an intermediate layer is situated between the epilayer and the silicon layer, the intermediate layer having a higher doping than the epilayer, the intermediate layer having a seventh material that has the first conductivity type.

4. The power MOSFET as recited in claim 3, wherein the second trenches extend at least into the intermediate layer.

5. The power MOSFET as recited in claim 2, wherein the silicon layer is situated on a first metal layer, which functions as a backside metallization.

6. The power MOSFET as recited in claim 1, wherein the first conductivity type corresponds to an n-type doping and the second conductivity type corresponds to a p-type doping.

7. The power MOSFET as recited in claim 1, wherein the second trenches have a greater width than the first trenches.

8. The power MOSFET as recited in claim 1, wherein the second material includes boron ions.

9. The power MOSFET as recited in claim 8, wherein a concentration of the boron ions on a surface of the second trenches is greater than $10^{18}$ cm$^{-3}$.

10. A method for producing a power MOSFET having a trench structure, the method comprising:
 producing first trenches;
 producing second trenches, the first trenches and the second trenches forming the trench structure, the first trenches and the second trenches being arranged in alternation,
 partially filling the first trenches with a first material, which has a first conductivity type; and
 filling the second trenches with a second material that has a second conductivity type, the first conductivity type and the second conductivity type differing from each other,
 wherein the trenches are provided in a substrate, wherein the substrate includes a source layer, a body layer, an epilayer, an intermediate later, and a silicon layer, wherein the intermediate layer is situated between the epilayer and the silicon layer,
 wherein the intermediate layer has a higher doping than the epilayer, and the intermediate layer has a seventh material that has the first conductivity type,
 wherein the second trenches extend into the intermediate layer.

11. The method as recited in claim 10, further comprising:
 producing a dielectric layer on a trench surface of the first trenches by thermal oxidation.

12. The method as recited in claim 10, further comprising:
 tempering at a temperature range between 850° C. and 1000° C. and a duration of 30 seconds to three minutes.

* * * * *